United States Patent
Yoon et al.

(10) Patent No.: US 9,224,970 B2
(45) Date of Patent: Dec. 29, 2015

(54) ORGANIC LIGHT EMITTING DIODE, ORGANIC LIGHT EMITTING DISPLAY PANEL INCLUDING THE ORGANIC LIGHT EMITTING DIODE AND METHOD OF MANUFACTURING THE ORGANIC LIGHT EMITTING DISPLAY PANEL

(71) Applicant: Samsung Display Co., Ltd., Yongin, Gyeonggi-do (KR)

(72) Inventors: Ji-Hwan Yoon, Yongin (KR); Il Soo Oh, Yongin (KR)

(73) Assignee: Samsung Display Co., Ltd. (KR)

( * ) Notice: Subject to any disclaimer, the term of this patent is extended or adjusted under 35 U.S.C. 154(b) by 28 days.

(21) Appl. No.: 13/855,385

(22) Filed: Apr. 2, 2013

(65) Prior Publication Data

US 2014/0084267 A1 Mar. 27, 2014

(30) Foreign Application Priority Data

Sep. 24, 2012 (KR) .................. 10-2012-0105857

(51) Int. Cl.
*H01L 29/08* (2006.01)
*H01L 33/00* (2010.01)
*H01L 51/50* (2006.01)
*H01L 27/32* (2006.01)
*H01L 51/52* (2006.01)
*H01L 51/00* (2006.01)

(52) U.S. Cl.
CPC ........ *H01L 51/5064* (2013.01); *H01L 27/3211* (2013.01); *H01L 27/3276* (2013.01); *H01L 51/5004* (2013.01); *H01L 51/5275* (2013.01); *H01L 51/0013* (2013.01); *H01L 51/5012* (2013.01); *H01L 51/5056* (2013.01); *H01L 51/5072* (2013.01); *H01L 51/5088* (2013.01)

(58) Field of Classification Search
CPC . H01L 51/5064; H01L 27/3276; H01L 51/05; H01L 27/32; H01L 51/52; H01L 51/0013
USPC ................. 257/40, 72, 89, 98, 88, E51.018, 257/E51.026, E33.055; 438/82, 99, 107, 16
See application file for complete search history.

(56) References Cited

U.S. PATENT DOCUMENTS

| | | | |
|---|---|---|---|
| 2002/0057050 A1* | 5/2002 | Shi | ................................ 313/504 |
| 2003/0034938 A1* | 2/2003 | Yamada | .......................... 345/76 |
| 2003/0141805 A1 | 7/2003 | Lee et al. | |
| 2004/0224182 A1* | 11/2004 | Lazarev | ........................ 428/690 |

(Continued)

FOREIGN PATENT DOCUMENTS

| | | |
|---|---|---|
| JP | 2012-028067 | 2/2012 |
| KR | 10-2003-0064028 | 7/2003 |

*Primary Examiner* — Amar Movva
*Assistant Examiner* — Sheikh Maruf
(74) *Attorney, Agent, or Firm* — Knobbe Martens Olson & Bear LLP

(57) ABSTRACT

An organic light emitting diode includes a first electrode layer, a first common layer disposed on the first electrode layer, an organic light emitting layer disposed on the first common layer, a second common layer disposed on the organic light emitting layer, and a second electrode layer disposed on the second common layer. The organic light emitting layer and the first common layer have the same directional property. Since an injection/transportation of charge at an interface of the first common layer and the organic light emitting layer becomes smooth, charges are not accumulated at the interface. Thus, life of the organic light emitting diode is extended.

16 Claims, 9 Drawing Sheets

(56) References Cited

U.S. PATENT DOCUMENTS

| | | | |
|---|---|---|---|
| 2006/0033452 A1* | 2/2006 | Yamazaki et al. | 315/291 |
| 2007/0045621 A1* | 3/2007 | Suzuki et al. | 257/40 |
| 2008/0309232 A1* | 12/2008 | Yamamoto | 313/505 |
| 2009/0295275 A1* | 12/2009 | Parham et al. | 313/504 |
| 2010/0155711 A1* | 6/2010 | Hasegawa et al. | 257/40 |
| 2010/0181562 A1* | 7/2010 | Seo et al. | 257/40 |
| 2010/0184942 A1* | 7/2010 | Chen et al. | 528/423 |
| 2010/0259165 A1* | 10/2010 | Miura | 313/505 |
| 2011/0108810 A1* | 5/2011 | Kishino | 257/40 |
| 2012/0062108 A1* | 3/2012 | Mima | 313/504 |
| 2013/0009138 A1* | 1/2013 | Seo et al. | 257/40 |
| 2014/0151709 A1* | 6/2014 | Nishiyama et al. | 257/72 |

* cited by examiner

ORGANIC LIGHT EMITTING DIODE,
ORGANIC LIGHT EMITTING DISPLAY
PANEL INCLUDING THE ORGANIC LIGHT
EMITTING DIODE AND METHOD OF
MANUFACTURING THE ORGANIC LIGHT
EMITTING DISPLAY PANEL

CROSS-REFERENCE TO RELATED
APPLICATIONS

This U.S. non-provisional patent application claims priority under 35 U.S.C. §119 of Korean Patent Application No. 10-2012-0105857, filed in the Korean Patent Office on Sep. 24, 2012, the entire contents of which are hereby incorporated by reference.

BACKGROUND

Field

The present disclosure relates to an organic light emitting diode of which a life is extended, an organic light emitting display panel including the organic light emitting diode and a method of manufacturing the organic light emitting display panel.

An organic light emitting display device includes an organic light emitting display panel and a driver controlling the organic light emitting display panel. The organic light emitting display panel includes a plurality of pixels. Each of the plurality of pixels includes an organic light emitting diode.

The organic light emitting diode includes two electrodes and an organic light emitting layer disposed between the two electrodes. Different common layers are disposed between one electrode and the organic light emitting layer and between the other electrode and the organic light emitting layer respectively. The two electrodes are divided into an anode and a cathode according to a voltage level being applied to each electrode.

A first common layer which contributes to injection/transportation of hole is disposed between the anode and the organic light emitting layer. A second common layer which contributes to injection/transportation of electron is disposed between the cathode and the organic light emitting layer. A life of the organic light emitting diode is determined according to a characteristic of interfaces between the organic light emitting layer and the first common layer and between the organic light emitting layer and the second common layer.

SUMMARY OF CERTAIN INVENTIVE ASPECTS

Embodiments provide an organic light emitting diode. The organic light emitting diode can include a first electrode layer; a first common layer disposed on the first electrode layer; an organic light emitting layer disposed on the first common layer; a second common layer disposed on the organic light emitting layer; and a second electrode layer disposed on the second common layer. The organic light emitting layer and the first common layer have a same directional property as one another.

Embodiments also provide an organic light emitting display panel. The organic light emitting display panel can include a base substrate; and a plurality of pixels disposed on the base substrate, each of the plurality of pixels comprising an organic light emitting diode. The organic light emitting diode comprises a first electrode; a first common layer disposed on the first electrode; an organic light emitting pattern disposed on the first common layer; a second common layer disposed on the organic light emitting pattern; and a second electrode disposed on the second common layer. The organic light emitting pattern and the first common layer have a same directional property as one another.

Embodiments also provide a method of manufacturing an organic light emitting display panel. The method can include forming a first electrode layer including a plurality of first electrodes on a base substrate; forming a pixel defining layer including a plurality of openings exposing parts of the plurality of first electrodes respectively; forming a first common layer overlapping the pixel defining layer and the exposed parts of the plurality of first electrodes; forming an organic light emitting layer including a plurality of organic light emitting patterns disposed on areas corresponding to the plurality of openings respectively; forming a second common layer covering the organic light emitting layer on the first common layer; and forming a second electrode layer on the second common layer. The organic light emitting layer and the first common layer have a same directional property as one another.

BRIEF DESCRIPTION OF THE DRAWINGS

Certain embodiments of the invention will be described below in more detail with reference to the accompanying drawings. The embodiments may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numerals generally refer to like elements throughout.

Figure 1:
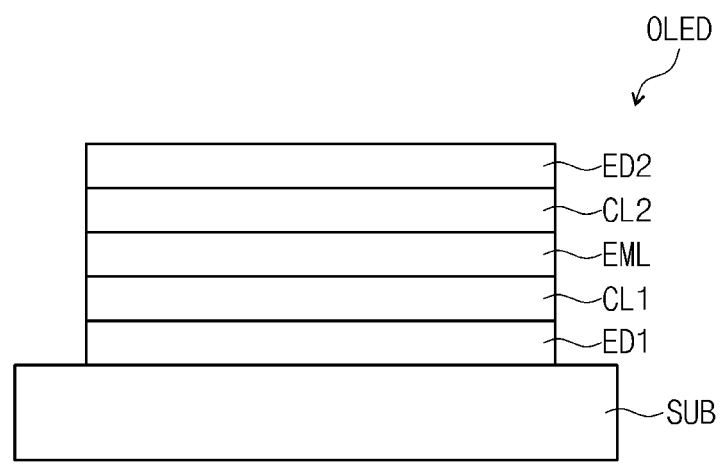
FIG. 1 is a cross sectional view of organic light emitting diode in accordance with some embodiments.

DETAILED DESCRIPTION OF CERTAIN
INVENTIVE EMBODIMENTS

Certain embodiments will be described more fully hereinafter with reference to the accompanying drawings, in which some embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numerals generally refer to like elements throughout.

Figure 2:
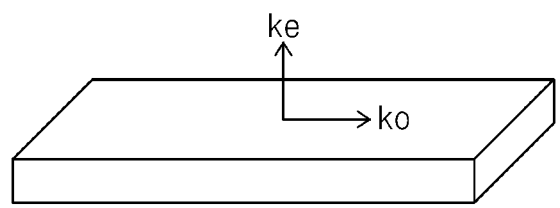
FIG. 2 is a drawing illustrating an optical constant determining a directional property of layers included in an embodiment of an organic light emitting diode.

FIG. 1 is a cross sectional view of organic light emitting diode in accordance with some embodiments. FIG. 2 is a drawing illustrating an optical constant determining a directional property of layers included in an embodiment of the organic light emitting diode.

As illustrated in FIG. 1, an organic light emitting diode (OLED) includes a first electrode layer ED1, a first common layer CL1, an organic light emitting layer EML, a second common layer CL2 and a second electrode layer ED2. The organic light emitting diode (OLED) is disposed on a base substrate SUB. The base substrate SUB can be a glass substrate or a plastic substrate. The organic light emitting diode can be directly mounted on one surface of the base substrate SUB or can be disposed on an insulating layer (not shown) disposed on one surface of the base substrate SUB. The insulating layer can include an organic layer and/or an inorganic layer.

The first electrode layer ED1 and the second electrode layer ED2 receive voltages having different levels. In some embodiments, the first electrode layer ED1 is described as an anode electrode and the second electrode layer ED2 is describe as a cathode electrode.

The anode electrode ED1 is constituted by a material having high conductivity and a high work function. A material constituting the anode ED1 can be changed according to a light emitting direction of the organic light emitting diode (OLED). The anode electrode ED1 of organic light emitting diode (OLED) of bottom emission type can include an Indium Tin Oxide, an Indium Zinc Oxide, an oxide of tin or an oxide of zinc. The anode electrode ED1 of organic light emitting diode (OLED) of top emission type can include a metal.

The cathode electrode ED2 is constituted by a material having a low work function. The cathode electrode ED2 can include a metal such as lithium, magnesium, aluminum, and the like. The cathode electrode ED2 of organic light emitting diode (OLED) of top emission type is constituted by a transparent conductive material such as, for example, a metallic oxide.

The first common layer CL1 is disposed on the anode electrode ED1. The first common layer CL1 includes a hole injection layer to ease a hole injection from the anode electrode ED1. The hole injection layer can include a metallic compound having a semiconductor characteristic or can include an organic matter and/or inorganic matter.

The organic light emitting layer EML is disposed on the first common layer CL1. The organic light emitting layer EML generates a blue light, a green light, a red light, or a white light. The organic light emitting layer EML includes a fluorescent light emitting material or a phosphorescent light emitting material.

The second common layer CL2 is formed on the organic light emitting layer EML. The second common layer CL2 includes an electron injection layer to ease an electron injection from the cathode electrode ED2. The cathode electrode ED2 is disposed on the second common layer CL2.

The organic light emitting layer EML and the first common layer CL1 have the same directional property. When a molecule arrangement of material constituting the first common layer CL1 is irregular, a molecule arrangement of material constituting the organic light emitting layer EML is also irregular.

When a molecule arrangement of material constituting the first common layer CL1 is regular, a molecule arrangement of material constituting the organic light emitting layer EML is also regular. The material constituting the first common layer CL1 and the material constituting the organic light emitting layer EML can all have a molecule arrangement of vertical direction.

In FIG. 2, a method of measuring the directional property of the organic light emitting layer EML and the first common layer CL1 is conceptually illustrated. The directional property is measured by ellipsometry. The directional property is determined by an optical constant in accordance with mathematical formula 1 below.

$$S1 = \frac{K_e - K_o}{K_e + 2K_o}$$ [mathematical formula 1]

Herein, S1 indicates the optical constant. Ke indicates a value of imaginary part of complex index of refraction of a thickness direction of the organic light emitting layer EML and the first common layer CL1. Ko indicates a value of imaginary part of complex index of refraction of a surface direction of the organic light emitting layer EML and the first common layer CL1.

When the optical constant of each of the organic light emitting layer EML and the first common layer CL1 measured by ellipsometry is within the range of mathematical formula 2, the organic light emitting layer EML and the first common layer CL1 are judged to be all isotropic.

$$0.05 < S1 < 0.05$$ [mathematical formula 2]

When the optical constant, which is measured by ellipsometry, of each of the organic light emitting layer EML and the first common layer CL1 is outside the range of mathematical formula 2, the organic light emitting layer EML and the first common layer CL1 are judged to be all anisotropic.

An interface characteristic of the organic light emitting layer EML and the first common layer CL1 having the same directional property is improved. Since a hole injection becomes smooth at an interface of the organic light emitting layer EML and the first common layer CL1, a hole is not accumulated at the interface of the organic light emitting layer EML and the first common layer CL1. Therefore, life of the organic light emitting diode is extended.

The second common layer CL2 can also have the same directional property as the organic light emitting layer EML. When a molecule arrangement of material constituting the organic light emitting layer EML is irregular, a molecule arrangement of material constituting the second common layer CL2 is also irregular. When a molecule arrangement of material constituting the organic light emitting layer EML is regular, a molecule arrangement of material constituting the second common layer CL2 is also regular.

Since an electron injection becomes smooth at an interface of the organic light emitting layer EML and the second common layer CL2, an electron is not accumulated at the interface of the organic light emitting layer EML and the second common layer CL2. Therefore, life of the organic light emitting diode is extended.

Figure 3:
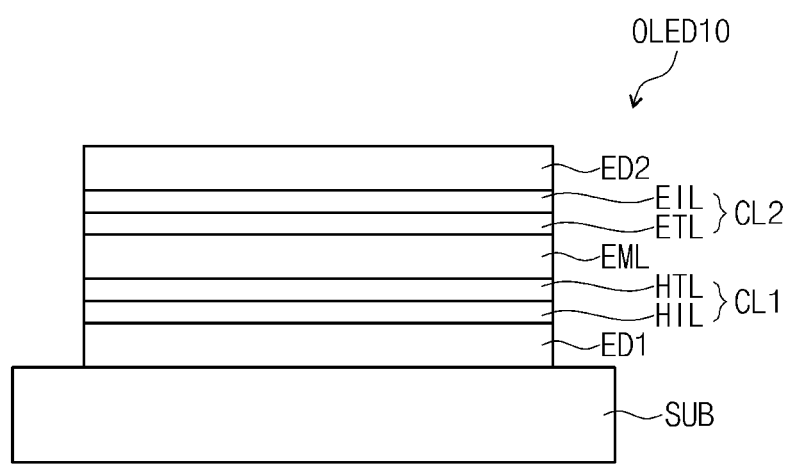
FIG. 3 is a cross sectional view of organic light emitting diode in accordance with some other embodiments.

FIG. 3 is a cross sectional view of organic light emitting diode in accordance with some other embodiments.

As illustrated in FIG. 3, the first common layer CL1 of the organic light emitting diode OLED10 further includes a hole transportation layer (HTL) for easing a hole transportation from the hole injection layer (HIL) to the organic light emitting layer EML. The hole transportation layer (HTL) is disposed between the hole injection layer (HIL) and the organic light emitting layer EML. The hole transportation layer (HTL) has the same directional property as the organic light emitting layer EML.

The second common layer CL2 further includes an electron transportation layer (ETL) having a high electron mobility for an efficient electron transportation. The electron transportation layer (ETL) is disposed between the organic light emitting layer EML and the electron injection layer (EIL). The electron transportation layer (ETL) has the same directional property as the organic light emitting layer EML.

Figure 4:
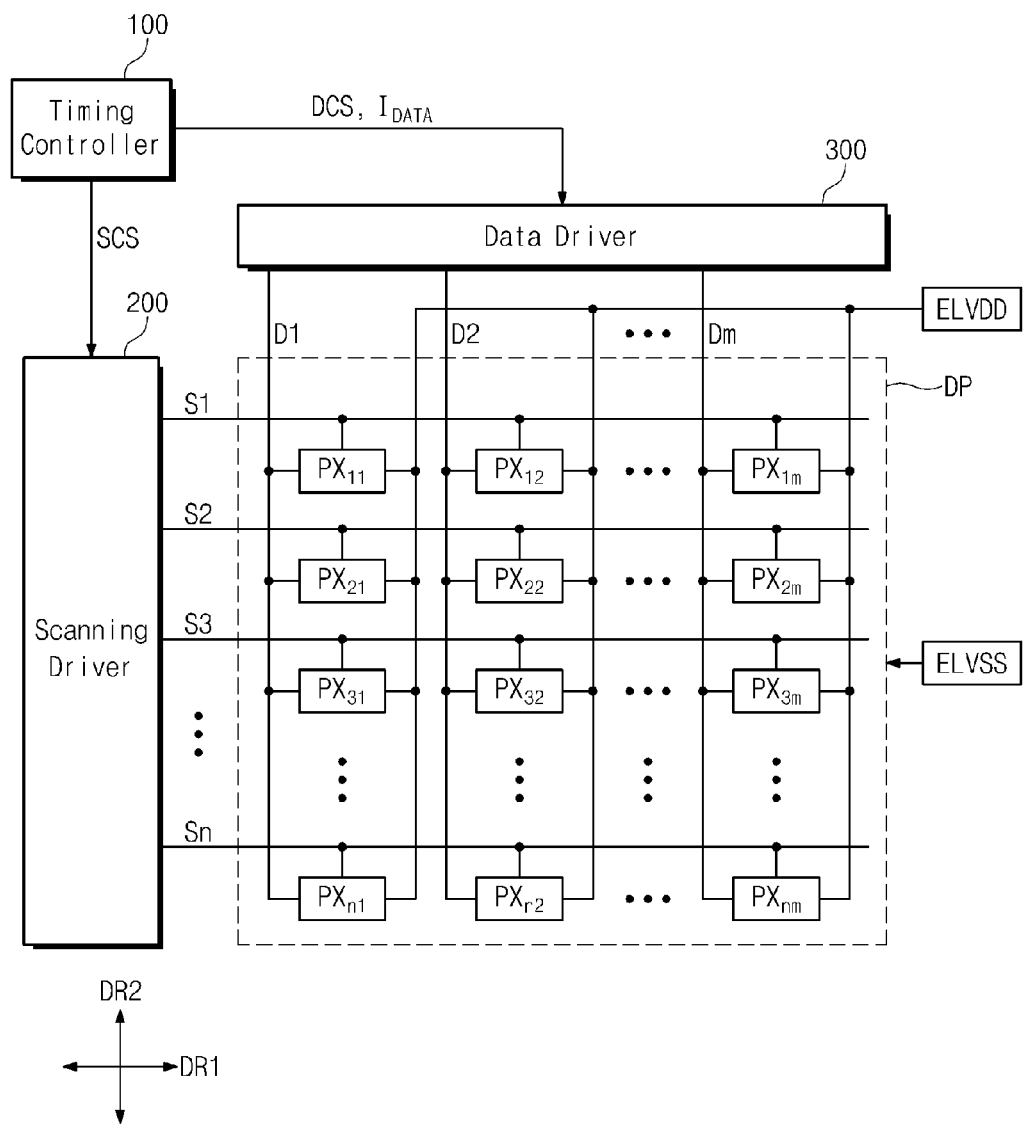
FIG. 4 is a block diagram of organic light emitting display device in accordance with some embodiments.
Figure 5:
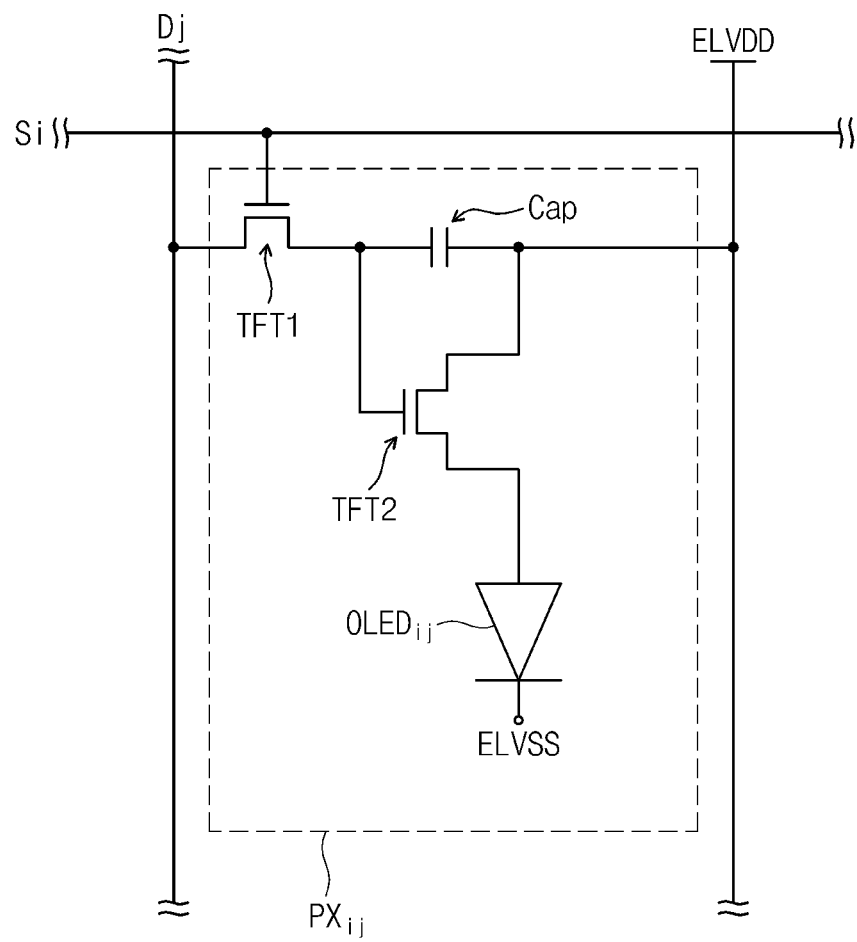
FIG. 5 is an equivalent circuit diagram in accordance with some embodiments.

FIG. 4 is a block diagram of organic light emitting display device in accordance with some embodiments. FIG. 5 is an equivalent circuit diagram in accordance with some embodiments.

Referring to FIG. 4, an organic light emitting display device includes an organic light emitting display panel (DP, hereinafter referred to as display panel), a timing controller 100, a scanning driver 200 and a data driver 300.

The display panel DP includes a plurality of scanning lines S1-Sn disposed on the base substrate SUB, a plurality of data lines D1-Dm, and a plurality of pixels PX11-PXnm connected to corresponding scanning lines among the plurality of scanning lines S1-Sn and corresponding data lines among the plurality of data lines D1-Dm.

The plurality of scanning lines S1-Sn extends in a first direction DR1 on one surface of the base substrate SUB and is arranged in a second direction DR2 crossing the first direction DR1. The plurality of data lines D1-Dm crosses the plurality of scanning lines S1-Sn while being insulated from the plurality of scanning lines S1-Sn. The plurality of data lines D1-Dm extends in the second direction DR2 and is arranged in the first direction DR1.

The display panel DP is supplied with a first power supply voltage ELVDD and a second power supply voltage ELVSS from the outside. Each of the pixels PX11-PXnm is turned on in response to a corresponding scanning signal. Each of the pixels PX11-PXnm receives the first power supply voltage ELVDD and a second power supply voltage ELVSS and generates a light in response to a corresponding data signal. A level of the first power supply voltage ELVDD is higher than a level of the second power supply voltage ELVSS.

Each of the pixels PX11-PXnm includes at least one transistor, at least one capacitor and an organic light emitting diode. In FIG. 5, an equivalent circuit of pixel PXij connected to ith scanning line Si among the plurality of scanning lines S1-Sn and jth data line Dj among the plurality of data lines D1-Dm is illustrated as an illustration.

The pixel PXij includes a first transistor TFT1, a second transistor TFT2, a capacitor Cap and an organic light emitting diode OLEDij. The first transistor TFT1 includes a control electrode connected to ith scanning line Si, an input electrode connected to jth data line Dj and an output electrode. The first transistor TFT1 outputs a data signal applied to the jth data line Dj in response to a scanning signal applied to the ith scanning line Si.

The capacitor Cap includes a first electrode connected to the first transistor TFT1 and a second electrode receiving the first power supply voltage ELVDD. The capacitor Cap charges electrical charges corresponding to a difference between a voltage corresponding to the data signal received from the first transistor TFT1 and the first power supply voltage ELVDD.

The second transistor TFT2 includes a control electrode connected to the output electrode of the first transistor TFT1 and the first electrode of the capacitor Cap, an input electrode receiving the first power supply voltage ELVDD and an output electrode. The output electrode of the second transistor TFT2 is connected to the organic light emitting diode OLEDij.

The second transistor TFT2 controls a driving current flowing through the organic light emitting diode $OLED_{ij}$ in response to electrical charges stored in the capacitor Cap. A turn-on time of the second transistor TFT2 is determined according to electrical charges stored in the capacitor Cap. Substantially, the output electrode of the second transistor TFT2 supplies a voltage having a lower level than the first power supply voltage ELVDD to the organic light emitting diode $OLED_{ij}$.

The organic light emitting diode OLEDij emits a light during a turn-on section of the second transistor TFT2. A color of a light generated from the organic light emitting diode OLEDij is determined by a material constituting the organic light emitting diode OLEDij. For instance, a color of a light generated from the organic light emitting diode OLEDij can be one of red, green, blue and white.

The timing controller 100 receives an input image signals and outputs image data IDATA converted in accordance with an operation mode of the display panel DP and various kinds of control signals SCS and DCS.

The scanning driver 200 receives a scanning drive control signal SCS from the timing controller 100. The scanning driver 200 that receives the scanning drive control signal SCS generates a plurality of scanning signals. The plurality of scanning signals is sequentially supplied to the plurality of scanning lines S1-Sn.

The data driver 300 receives a data drive control signal DCS and the converted image data IDATA. The data driver 300 generates a plurality of data signals on the basis of the data drive control signal DCS and the converted image data IDATA. The plurality of data signals is supplied to the plurality of data lines D1-Dm.

Figure 6:
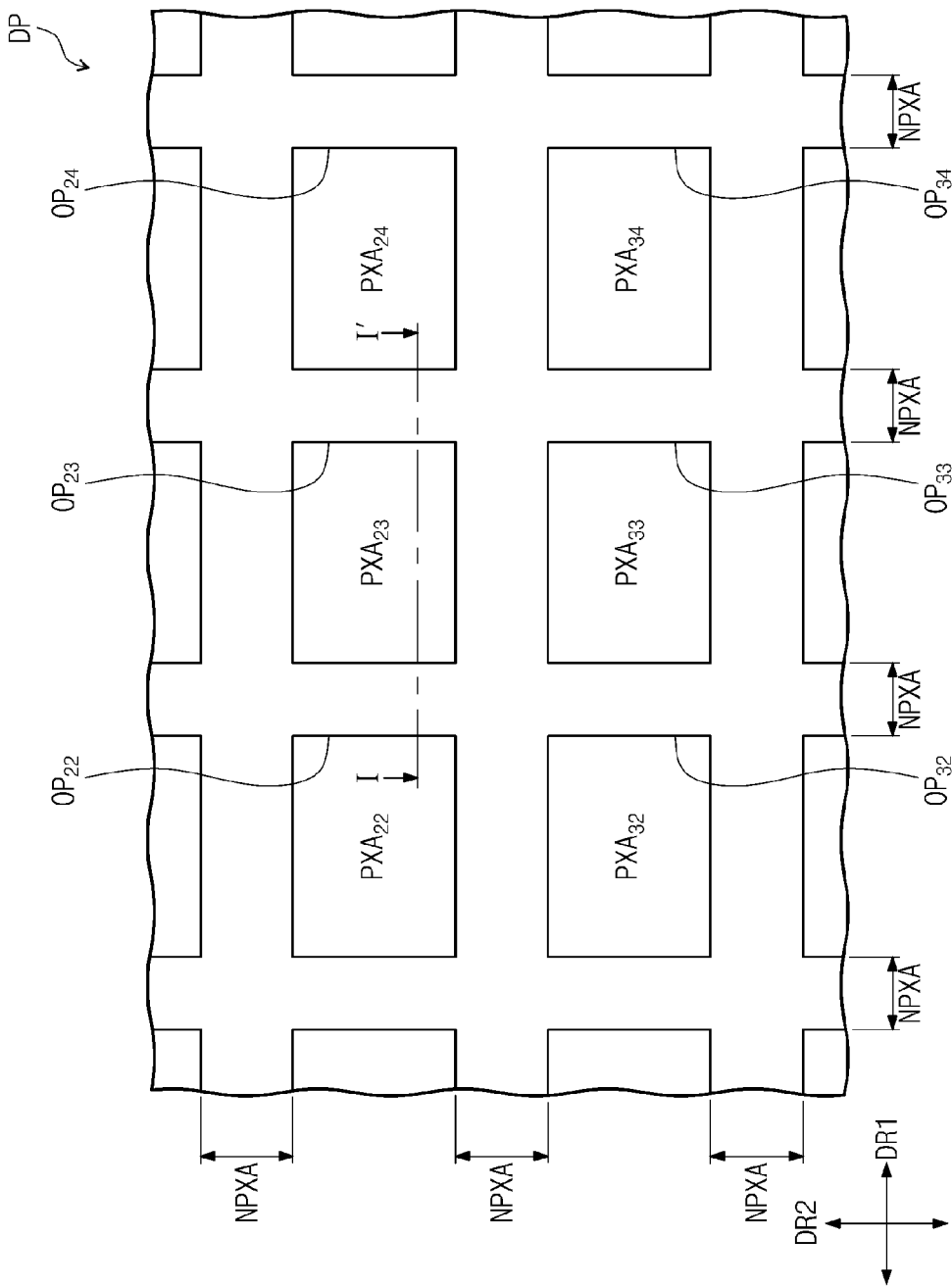
FIG. 6 is a top plan view illustrating a portion of organic light emitting display panel illustrated in FIG. 5.
Figure 7:
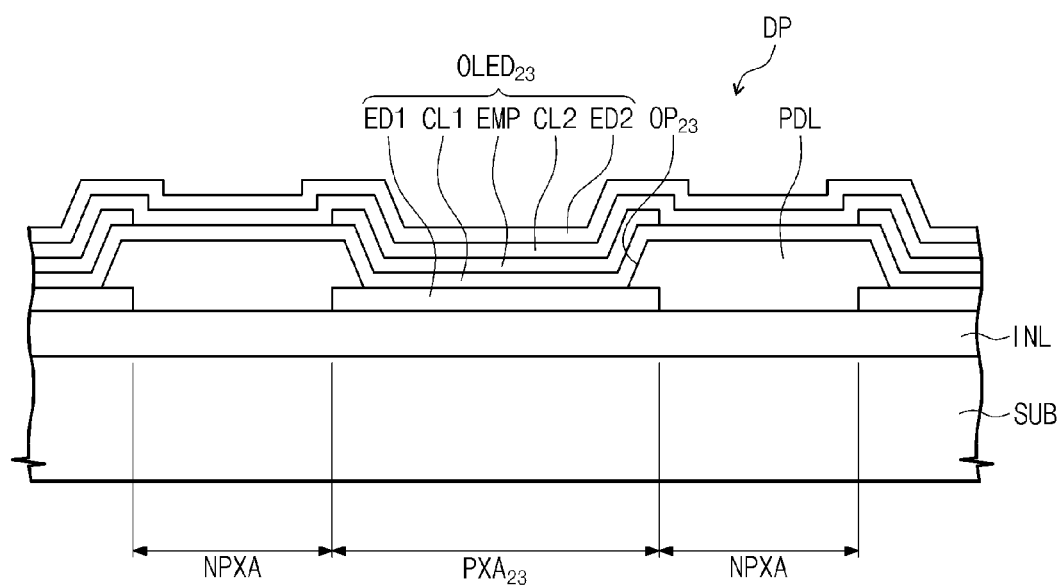
FIG. 7 is a cross sectional view taken along the line I-I' of FIG. 6.

FIG. 6 is a top plan view illustrating a portion of organic light emitting display panel illustrated in FIG. 5. FIG. 7 is a cross sectional view taken along the line I-I' of FIG. 6. In FIG. 6, six light emitting areas PXA22-PXA34 corresponding to six openings OP22-OP34 are illustrated as an illustration. In FIG. 7, a cross section of one light emitting area PXA23 is illustrated as an illustration. In FIG. 7, an organic light emitting diode having the same layer structure as the organic light emitting diode illustrated in FIG. 1 is illustrated as an illustration.

As illustrated in FIG. 6, the display panel DP is divided into a plurality of light emitting areas PXA22-PXA34 and a non-light emitting area NPXA adjacent to the plurality of light emitting areas PXA22-PXA34. The plurality of light emitting areas PXA22-PXA34 is surrounded by the non-light emitting area NPXA. First electrodes of organic light emitting diodes of the plurality of pixels PX11-PXnm are disposed in the plurality of light emitting areas PXA22-PXA34 respectively.

As illustrated in FIG. 7, an insulating layer INL is disposed on one surface of the base substrate SUB. Although not illustrated in the drawing, the insulating layer INL can include a plurality of thin films. The plurality of thin films can include an inorganic thin film and/or an organic thin film. Thin film transistors can be formed between one surface of the base substrate SUB and the insulating layer INL. The thin film transistors can be the first transistor TFT1 and the second transistor TFT2.

The organic light emitting diode OLED23 is disposed on the insulating layer INL. The organic light emitting diode OLED23 includes a first electrode ED1, a first common layer CL1, an organic light emitting pattern EMP, a second common layer CL2, and a second electrode ED2. In some embodiments, the organic light emitting diode OLED23 can be the organic light emitting diode illustrated in FIG. 1.

The anode electrode ED1 is disposed on the insulating layer INL while corresponding to the light emitting area PXA23. The anode electrode ED1 receives the first power supply voltage ELVDD. Although not illustrated in the drawing, anode electrodes disposed on the plurality of light emitting areas PXA22-PXA34 constitute a first electrode layer at a display panel level.

A pixel defining layer PDL including an opening OP23 is disposed on the insulating layer INL. The opening OP23 corresponds to the light emitting area PXA23. The opening OP23 exposes at least a part of the anode electrode ED1.

The first common layer CL1 is disposed on the first electrode ED1 and the pixel defining layer PDL. Although not illustrated in the drawing, the first common layer CL1 of a single body form is disposed on the plurality of light emitting areas PXA22-PXA34 and the non-light emitting area NPXA. In some embodiments, the first common layer CL1 includes a hole injection layer. The first common layer CL1 can further include a hole transportation layer.

The organic light emitting pattern EMP is disposed on the first common layer CL1 while corresponding to the light emitting area PXA23. Although not illustrated in the drawing, a plurality of organic light emitting patterns disposed on the plurality of light emitting areas PXA22-PXA34 constitute an organic light emitting layer at a display panel level.

The second common layer CL2 is disposed on the organic light emitting pattern EMP and the first common layer CL1. Although not illustrated in the drawing, the second common layer CL2 of a single body form is disposed on the plurality of light emitting areas PXA22-PXA34 and the non-light emitting area NPXA. In some embodiments, the second common layer CL2 includes an electron injection layer. The second common layer CL2 can further include an electron transportation layer. In another embodiment of the inventive concept, the second common layer CL2 can be omitted.

The second electrode ED2 is disposed on the second common layer CL2 while corresponding to the light emitting area PXA23. Although not illustrated in the drawing, a plurality of second electrodes disposed on the plurality of light emitting areas PXA22-PXA34 constitute a second electrode layer at a display panel level. The second electrode ED2 receives the second power supply voltage ELVSS.

A protection layer and/or a color filter layer can be disposed on the second electrode ED2. Another base substrate facing the base substrate SUB can be disposed on the second electrode ED2. Another base substrate can be a sealing substrate protecting the plurality of pixels PX11-PXnm.

FIGS. 8A through 8F are cross sectional views illustrating a method of manufacturing an organic light emitting display panel in accordance with some embodiments.

FIGS. 8A through 8F illustrate a cross section corresponding to the light emitting area PXA23 illustrated in FIG. 7. FIGS. 8A through 8F illustrate a method of manufacturing an organic light emitting diode having the same layer structure as the organic light emitting diode illustrated in FIG. 1.

Figure 8A:
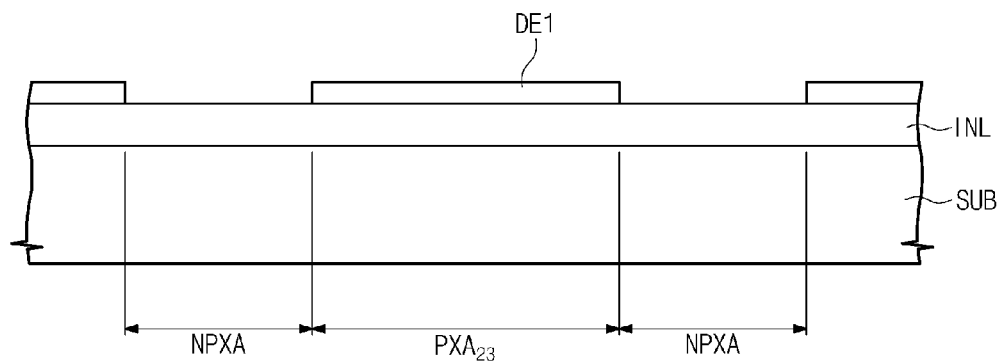
FIGS. 8A through 8F are cross sectional views illustrating a method of manufacturing an organic light emitting display panel in accordance with some embodiments.

As illustrated in FIG. 8A, an insulating layer INL is formed on a base substrate SUB. After an electrode layer is formed on one surface of the base substrate SUB, the first electrode ED1 can be formed by patterning the electrode layer. The first electrode ED1 can be disposed on the insulating layer INL.

The insulating layer INL can include a plurality of thin films sequentially stacked. Before the first electrode ED1 is formed, a thin film transistor can be formed on the base substrate SUB. The thin film transistor is formed through a deposition process, an exposure process and a development process. Since a process of forming the thin film transistor is apparent to those of ordinary skill in the art, a detailed description thereof is omitted. Any one of the plurality of thin films included in the insulating layer INL can constitute a part of the thin film transistor.

Figure 8B:
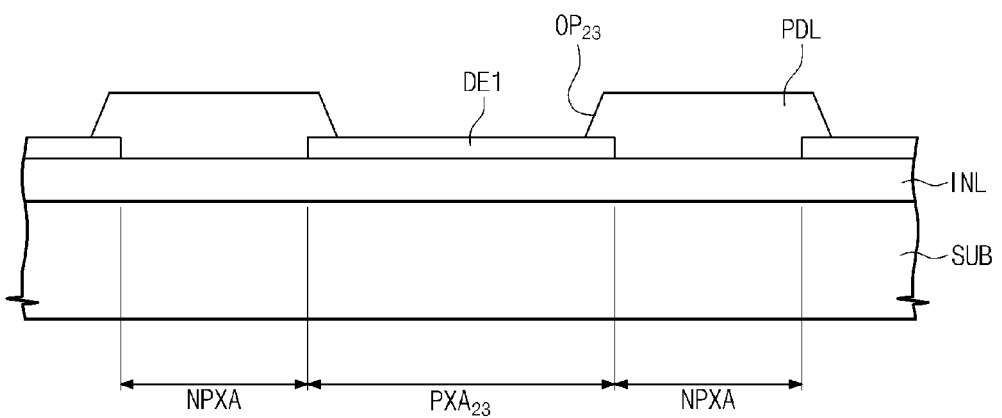

As illustrated in FIG. 8B, a pixel defining layer PDL is formed on the insulating layer INL. The pixel defining layer PDL includes an opening OP23 exposing a part of the first electrode ED1.

After forming a base membrane (not shown) covering the first electrode ED1, the pixel defining layer PDL having the opening OP23 is formed by patterning the base membrane. A process of patterning the base membrane includes an exposure process and a development process.

Figure 8C:
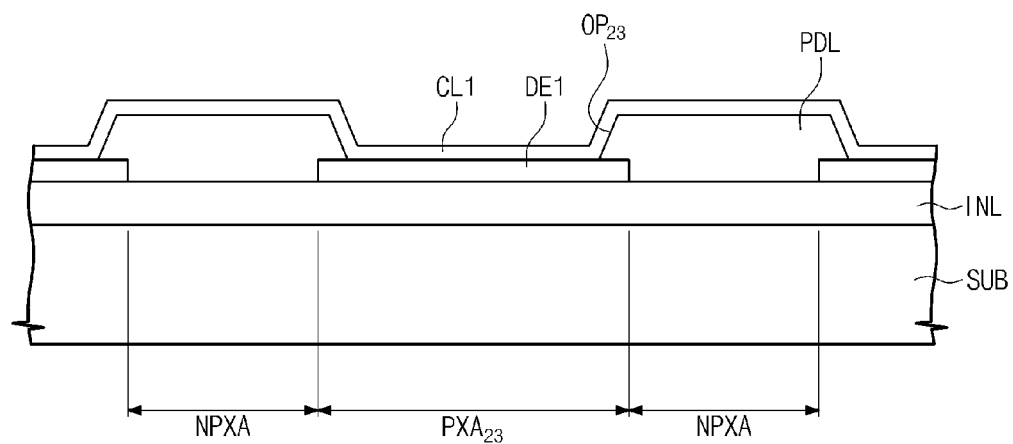

As illustrated in FIG. 8C, a first common layer CL1 is formed on the pixel defining layer PDL. The first common layer CL1 is in contact with the first electrode ED1. The first common layer CL1 can be formed by a printing method or a vacuum deposition method.

Figure 8D:
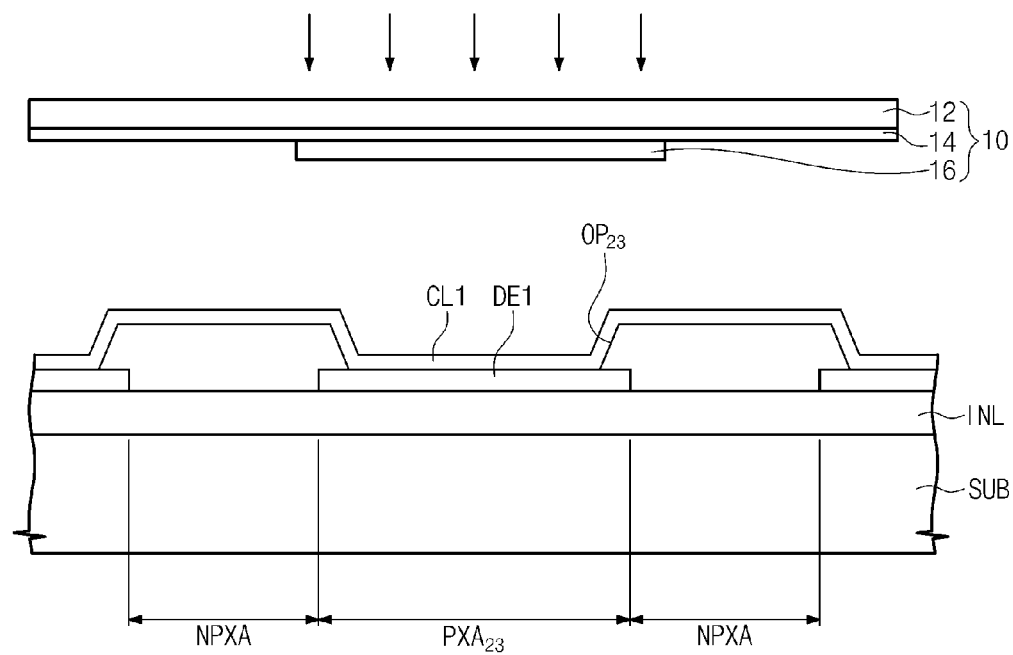
Figure 8E:
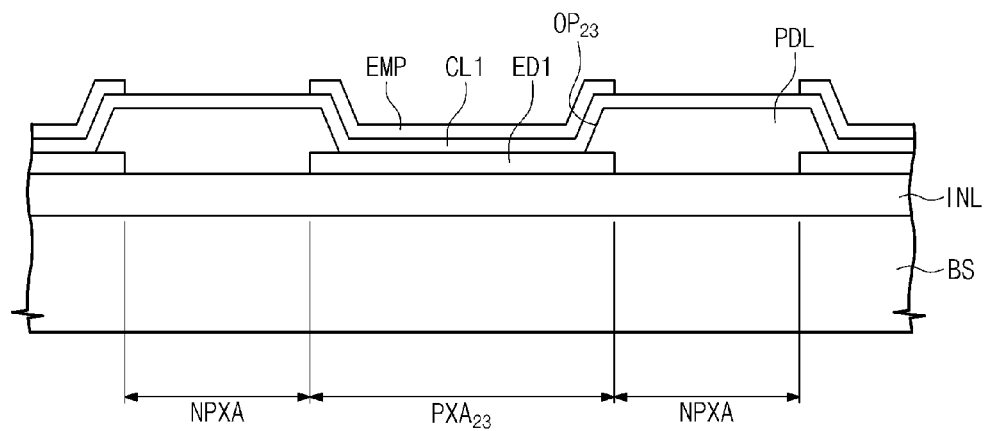

As illustrated in FIGS. 8D and 8E, an organic light emitting pattern EMP is formed on an area corresponding to the opening OP23. The organic light emitting pattern EMP is constituted by a material having the same directional property as that of the first common layer CL1.

As illustrated in FIG. 8D, the organic light emitting pattern EMP is formed using donor member 10 including a basal layer 12, a light-heat converting layer 14 and an organic light emitting transcription layer 16. In other embodiments, the organic light emitting transcription layer 16 can be formed on an entire surface of the light-heat converting layer 14.

The donor member 10 is disposed on the base substrate SUB so that the organic light emitting transcription layer 16 faces the first common layer CL1. After that, by irradiating a laser into the donor member 10, the organic light emitting transcription layer 16 is transferred to the first common layer CL1 so as to correspond to the opening OP23. Through those processes, the organic light emitting pattern EMP illustrated in FIG. 8E is formed.

The quality of interface characteristic of the organic light emitting pattern EMP formed by the laser transcription method and the first common layer CL1 is lower than that of interface characteristic of the organic light emitting pattern EMP formed by the deposition method and the first common layer CL1. For instance, an interface between the organic light emitting pattern EMP and the first common layer CL1 is irregular or an adhesive strength between the organic light emitting pattern EMP and the first common layer CL1 can be different depending on an area.

The first common layer CL1 and the organic light emitting pattern EMP having the same directional property compensate degradation of interface characteristic by the laser transcription method. In the method of manufacturing the organic light emitting display panel, the organic light emitting pattern EMP can be formed by different methods from the laser transcription method.

Figure 8F:
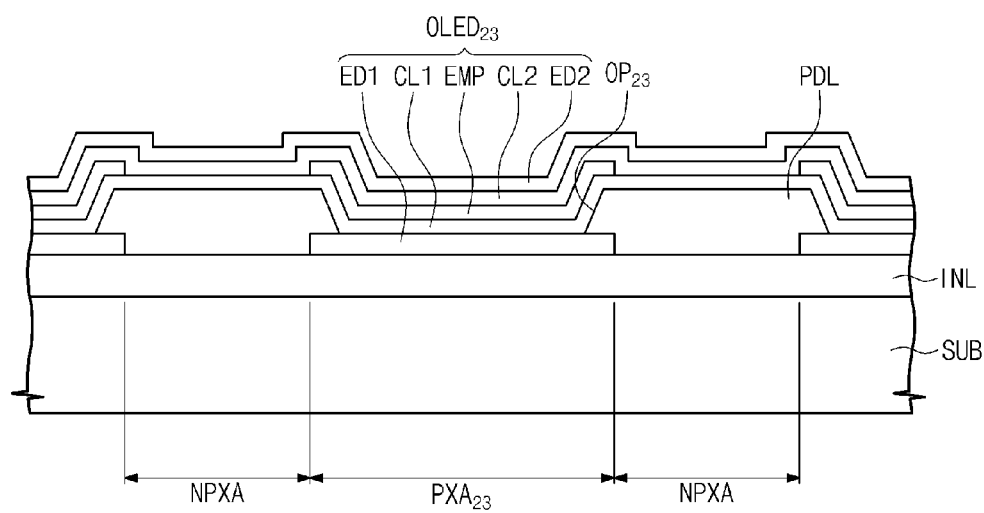

After that, a second common layer CL2 covering the organic light emitting pattern EMP is formed on the first common layer CL1 and a second electrode ED2 is formed on the second common layer CL2. When those processes are completed, the organic light emitting display panel illustrated in FIG. 8F is manufactured. The second common layer CL2 includes an electron injection layer. The second common layer CL2 can further include an electron transportation layer. The second common layer CL2 is constituted by a material having the same directional property as that of the organic light emitting pattern EMP. The second common layer CL2 can be omitted.

In the organic light emitting diode in accordance with some embodiments, a first common layer and an organic light emitting layer stacked on the first common layer have the same directional property. When a molecule arrangement of a material constituting the first common layer is irregular, a molecule arrangement of a material constituting the organic light emitting layer is also irregular. When a molecule arrangement of a material constituting the first common layer is regular, a molecule arrangement of a material constituting the organic light emitting layer is also regular.

An interface characteristic of the first common layer and the organic light emitting layer is improved. Since an injection/transportation of charge at an interface of the first common layer and the organic light emitting layer becomes smooth, charges are not accumulated at the interface. Thus, a life of the organic light emitting diode is extended.

While manufacturing the organic light emitting diode, the organic light emitting layer can be formed on the first common layer by a laser transcription method. An interface characteristic of the organic light emitting pattern EMP formed by the laser transcription method and the first common layer CL1 is lower than that of the organic light emitting pattern EMP formed by the deposition method and the first common layer CL1. The first common layer CL1 and the organic light emitting pattern EMP having the same directional property compensate degradation of interface characteristic by the laser transcription method.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. An organic light emitting diode comprising:
a first electrode layer;
a first common layer disposed on the first electrode layer;
an organic light emitting layer disposed on the first common layer;
a second common layer disposed on the organic light emitting layer; and
a second electrode layer disposed on the second common layer,
wherein the organic light emitting layer and the first common layer are both isotropic or the organic light emitting layer and the first common layer are both anisotropic, and
wherein the directional property is decided by an optical constant of each of the organic light emitting layer and the first common layer and wherein the optical constant follows:

$$S1 = \frac{K_e - K_o}{K_e + 2K_o}$$

wherein S1 is the optical constant, Ke is a value of an imaginary part of a complex index of refraction in a thickness direction and Ko is a value of an imaginary part of a complex index of refraction in a surface direction.

2. The organic light emitting diode of claim 1, wherein, when the optical constant of each of the organic light emitting layer and the first common layer is within the range of about −0.05 to 0.05, the organic light emitting layer and the first common layer are isotropic.

3. The organic light emitting diode of claim 2, wherein when the optical constant of each of the organic light emitting layer and the first common layer is outside the range of about −0.05 to 0.05, the organic light emitting layer and the first common layer are anisotropic.

4. The organic light emitting diode of claim 1, wherein the first common layer comprises a hole injection layer disposed on the first electrode layer and wherein the hole injection layer has the same directional property as the organic light emitting layer.

5. The organic light emitting diode of claim 4, wherein the first common layer further comprises a hole transportation layer disposed on the hole injection layer and the organic light emitting layer, and wherein the hole transportation layer has the same directional property as the organic light emitting layer.

6. The organic light emitting diode of claim 4, wherein the second common layer comprises an electron injection layer, and wherein the electron injection layer has the same directional property as the organic light emitting layer.

7. The organic light emitting diode of claim 6, wherein the second common layer further comprises an electron transportation layer disposed between the organic light emitting layer and the electron injection layer, and wherein the electron transportation layer has the same directional property as the organic light emitting layer.

8. An organic light emitting display panel comprising:
a base substrate; and
a plurality of pixels disposed on the base substrate, each of the plurality of pixels comprising an organic light emitting diode,
wherein the organic light emitting diode comprises:
a first electrode;
a first common layer disposed on the first electrode;
an organic light emitting pattern disposed on the first common layer;
a second common layer disposed on the organic light emitting pattern; and
a second electrode disposed on the second common layer,
wherein the organic light emitting pattern and the first common layer are both isotropic or the organic light emitting pattern and the first common layer are both anisotropic, and
wherein the directional property is decided by an optical constant of each of the organic light emitting layer and the first common layer and wherein the optical constant follows:

$$S1 = \frac{K_e - K_o}{K_e + 2K_o}$$

wherein S1 is the optical constant. Ke is a value of an imaginary part of a complex index of refraction in a thickness direction and Ko is a value of an imaginary part of a complex index of refraction in a surface direction.

9. The organic light emitting display panel of claim 8, wherein pixels of the plurality of pixels generate different colors from one another.

10. The organic light emitting display panel of claim 8, further comprising:
- a plurality of scanning lines disposed on the base substrate; and
- a plurality of data lines crossing the plurality of scanning lines while being insulated from the plurality of scanning lines, wherein each of the plurality of pixels comprises:
- a first transistor connected to a corresponding scanning line among the plurality of scanning lines and a corresponding data line among the plurality of data lines;
- a capacitor connected to the first transistor; and
- a second transistor controlling a driving current flowing the organic light emitting diode according to electrical charges stored in the capacitor, the second transistor being connected to the capacitor and the organic light emitting diode.

11. The organic light emitting display panel of claim 8, wherein when the optical constant of each of the organic light emitting pattern and the first common layer is within the range of about −0.05 to about 0.05, the organic light emitting pattern and the first common layer are isotropic.

12. The organic light emitting display panel of claim 11, wherein when the optical constant of each of the organic light emitting pattern and the first common layer is outside the range of about −0.05 to 0.05, the organic light emitting pattern and the first common layer are anisotropic.

13. The organic light emitting display panel of claim 8, wherein the first common layer comprises a hole injection layer disposed on the first electrode layer and wherein the hole injection layer has the same directional property as the organic light emitting pattern.

14. The organic light emitting display panel of claim 13, wherein the first common layer further comprises a hole transportation layer disposed on the hole injection layer and the organic light emitting pattern, and wherein the hole transportation layer has the same directional property as the organic light emitting pattern.

15. The organic light emitting display panel of claim 13, wherein the second common layer comprises an electron injection layer, and wherein the electron injection layer has the same directional property as the organic light emitting pattern.

16. The organic light emitting display panel of claim 15, wherein the second common layer further comprises an electron transportation layer disposed between the organic light emitting pattern and the electron injection layer, and wherein the electron transportation layer has the same directional property as the organic light emitting pattern.

* * * * *